(12) United States Patent
Chen

(10) Patent No.: US 7,420,268 B2
(45) Date of Patent: Sep. 2, 2008

(54) SEMICONDUCTOR CHIP PACKAGE AND APPLICATION DEVICE THEREOF

(75) Inventor: Tony K. T. Chen, Dasi Township, Taoyuan County (TW)

(73) Assignee: Quarton, Inc. (TW)

( * ) Notice: Subject to any disclaimer, the term of this patent is extended or adjusted under 35 U.S.C. 154(b) by 338 days.

(21) Appl. No.: 11/264,903

(22) Filed: Nov. 1, 2005

(65) Prior Publication Data

US 2007/0045802 A1    Mar. 1, 2007

(30) Foreign Application Priority Data

Aug. 30, 2005    (TW) ............................... 94129600 A

(51) Int. Cl.
*H01L 23/02* (2006.01)
(52) U.S. Cl. .......................... 257/686; 257/98; 257/99
(58) Field of Classification Search ................ 257/686, 257/723, 777, 81, 98, 99, 433, 434, 724
See application file for complete search history.

(56) References Cited

U.S. PATENT DOCUMENTS

| | | | |
|---|---|---|---|
| 5,235,672 A * | 8/1993 | Carson ........................ 706/26 |
| 5,241,456 A * | 8/1993 | Marcinkiewicz et al. ..... 361/792 |
| 5,869,896 A * | 2/1999 | Baker et al. .................. 257/724 |
| 5,907,178 A * | 5/1999 | Baker et al. .................. 257/433 |
| 6,220,722 B1 * | 4/2001 | Begemann ................... 362/231 |
| 6,492,725 B1 | 12/2002 | Loh et al. |
| 6,635,960 B2 * | 10/2003 | Farrar ......................... 257/723 |
| 6,635,987 B1 * | 10/2003 | Wojnarowski et al. ...... 313/498 |
| 6,686,654 B2 * | 2/2004 | Farrar et al. ................. 257/686 |
| 6,790,702 B2 * | 9/2004 | Farrar ......................... 438/107 |
| 6,861,287 B2 * | 3/2005 | Farrar et al. ................. 438/109 |
| 2007/0001282 A1 * | 1/2007 | Kang et al. .................. 257/692 |

* cited by examiner

*Primary Examiner*—S. V Clark
(74) *Attorney, Agent, or Firm*—Raymond Sun

(57) ABSTRACT

A semiconductor chip package has a pillar body including at least three conductors insulated from each other by an insulating layer. The pillar body has a periphery that includes a plurality of mounting faces, with each mounting face defined by two adjacent conductors separated by a portion of the insulating layer. A plurality of semiconductor chips are attached on the mounting faces and selectively and electrically connected to the conductors. The semiconductor package of the present invention can be used in a semiconductor illuminator which has a housing having a reflecting cup, with the pillar body positioned inside the reflecting cup.

21 Claims, 4 Drawing Sheets

SEMICONDUCTOR CHIP PACKAGE AND APPLICATION DEVICE THEREOF

BACKGROUND OF THE INVENTION

1. Field of the Invention

The present invention relates to a semiconductor chip package, and in particular, to a semiconductor chip package and an application device thereof, which can facilitate both the focusing of light and the dissipation of heat.

2. Description of the Prior Art

Semiconductor chips that have light emitting diodes (LEDs) are typically attached in a package structure and then applied in use in an application device. The package also pulls out some electrodes for supplying the power (which are required in operation) to the semiconductor chips.

Heat dissipation is usually not the primary concern for a package having a single LED chip with low power consumption. Recently, a package with multiple LED chips having high power consumption has been commonly used in a variety of application devices. When multiple LED chips are used for an application device, heat dissipation becomes an important consideration. For example, U.S. Pat. No. 6,492,725 discloses a concentrical package that facilitates heat dissipation in a multiple high power chip package. Although the problem of heat dissipation can be improved by using this package, the chips can only be attached on one side of the package, thereby significantly limiting the number of chips that can be attached on the package. Otherwise, this package cannot be used as a semiconductor illuminator because the fact that these semiconductor chips (such as the LED chips) are not evenly distributed along the periphery of the package means that the light emitted from these LED chips cannot be properly focused. Therefore, there remains a need to provide a semiconductor package which can facilitate the light focusing and heat dissipating functions.

SUMMARY OF THE INVENTION

It is an object of the present invention to provide a semiconductor chip package for use with an application device, which can facilitate both the requirements of light focusing and heat dissipation.

It is another object of the present invention to provide a semiconductor chip package for use with an application device, which allows a greater number of semiconductor chips to be provided on a smaller package body.

In order to achieve the objectives of the present invention, there is provided a semiconductor chip package having a pillar body including at least three conductors insulated from each other by an insulating layer. The pillar body has a periphery that includes a plurality of mounting faces, with each mounting face defined by two adjacent conductors separated by a portion of the insulating layer. A plurality of semiconductor chips are attached on the mounting faces and selectively and electrically connected to the conductors. The semiconductor package of the present invention can be used in a semiconductor illuminator which has a housing having a reflecting cup, with the pillar body positioned inside the reflecting cup.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
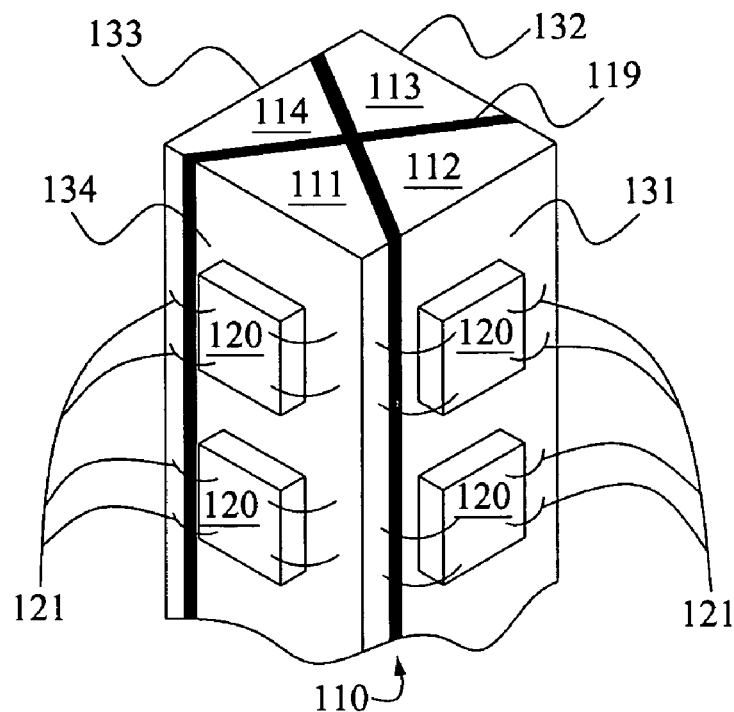
FIG. 1 is a perspective view schematically illustrating a semiconductor chip package in accordance with one embodiment of the present invention.
Figure 2:
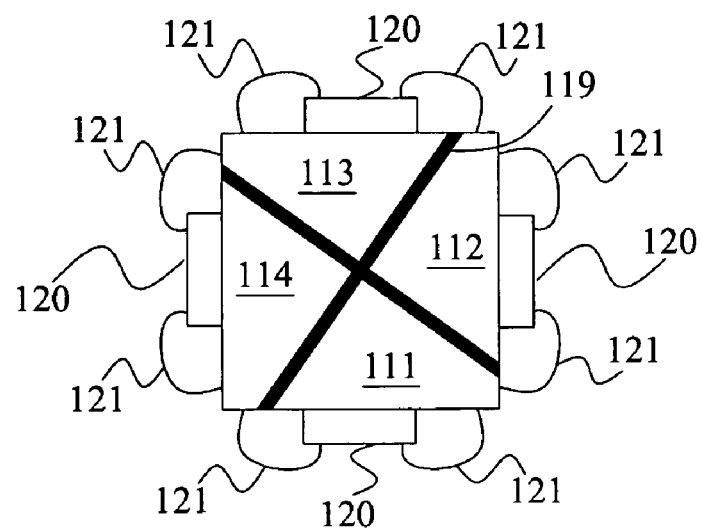
FIG. 2 is a top plan view of the semiconductor chip package of FIG. 1.

FIGS. 1 and 2 illustrate a semiconductor chip package in accordance with a first embodiment of the present invention. The semiconductor chip package has a four-sided (e.g., generally square) pillar body 110 and a plurality of semiconductor chips 120, such as light emitting diode (LED) chips. The pillar body 110 is divided into a plurality of elongated conductors 111, 112, 113 and 114, which are insulated from each other by an X-shaped insulating layer 119. The shapes of the conductors 111, 112, 113 and 114 are complementary to each other so as to form an isogonal quadrangular pillar body 110 having four mounting faces 131, 132, 133 and 134 that are evenly disposed around the periphery of the pillar body 110. In particular, each conductor 111, 112, 113, 114 has four sides, with a short external side, a long external side that adjoins the short external side, and two adjoining internal sides bordered by the insulating layer 119. Each of the mounting faces 131, 132, 133, 134 can have the same shape and size.

As shown in FIGS. 1 and 2, mounting face 131 is a plane that is defined by the short external side of the conductor 111 and the long external side of the conductor 112 that are insulated by the insulating layer 119. Mounting face 132 is a plane that is defined by the short external side of the conductor 112 and the long external side of the conductor 113 that are insulated by the insulating layer 119. Mounting face 133 is a plane that is defined by the short external side of the conductor 113 and the long external side of the conductor 114 that are insulated by the insulating layer 119. Mounting face 134 is a plane that is defined by the short external side of the conductor 114 and the long external side of the conductor 111 that are insulated by the insulating layer 119. Although the mounting faces 131, 132, 133 and 134 are all illustrated as being embodied as flat plane surfaces, those skilled in the art will know that any other surface (including non-flat surfaces) having appropriately differentiated heights can also be used.

Thus, in order to completely attach each of the semiconductor chips 120 on to one of the conductors 111, 112, 113, and 114, the insulating layer 119 is designed to divide each of the mounting faces 131, 132, 133 and 134 into unequal plane areas (i.e., the short and long external surfaces described above) for the two conductors that make up each mounting face 131, 132, 133 and 134. In other words, the plane area of conductors 111 and 112 on mounting face 131 are not equal, the plane area of conductors 112 and 113 on mounting face 132 are not equal, the plane area of conductors 113 and 114 on mounting face 133 are not equal, and the plane area of conductors 114 and 111 on mounting face 134 are not equal. As a result, each semiconductor chip 120 can be attached at about the central part of each the mounting faces 131, 132, 133 and 134.

Figure 8:
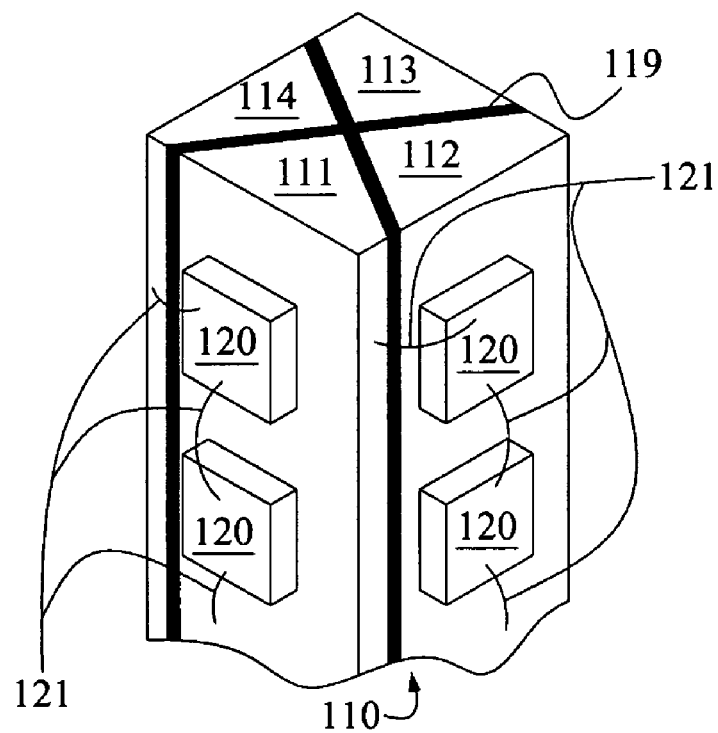
FIG. 8 is a perspective view schematically illustrating a semiconductor chip package in accordance with yet a further embodiment of the present invention.

Moreover, each of the semiconductor chips 120 may be selectively and electrically connected to the conductors 111, 112, 113, or 114 at both sides of the insulating layer 119 (on each mounting face 131, 132, 133, 134), or electrically connected to another semiconductor chip 120, via bonding wires 121. In FIGS. 1 and 2, each of the semiconductor chips 120 is electrically connected to two adjacent conductors 111, 112, 113, or 114 on the same mounting face 131, 132, 133 or 134 at both sides of the insulating layer 119 via bonding wires 121, such that the semiconductor chips 120 attached to the same conductor 111, 112, 113, or 114 can form a parallel connection. For example, all the chips 120 attached to the conductor 111 form a parallel connection, all the chips 120 attached to the conductor 112 form another parallel connection, and so on. Alternatively, as shown in FIG. 8, all the semiconductor chips 120 attached to the same conductor (e.g., 111) can first be connected to each other in series via bonding wires 121, and then electrically connected to an adjacent conductor (e.g., 114) at both sides of insulating layer 119 via a bonding wire 121. Also, those skilled in the art will appreciate that the semiconductor chips 120 attached on the same conductors 111, 112, 113 or 114 can be connected either in series, in parallel, or in series and in parallel, and then electrically connected to an adjacent conductor 111, 112 113, or 114 at both sides of insulating layer 119 via bonding wires 121. Thus, the semiconductor chip package in accordance with the present invention can be applied to a variety of applications having different power voltage requirements.

Figure 3:
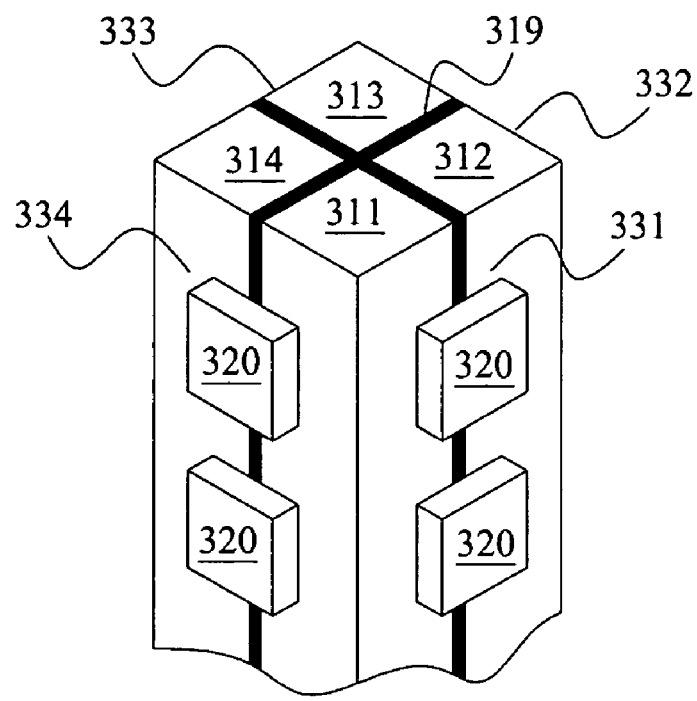
FIG. 3 is a perspective view schematically illustrating a semiconductor chip package in accordance with another embodiment of the present invention.
Figure 4:
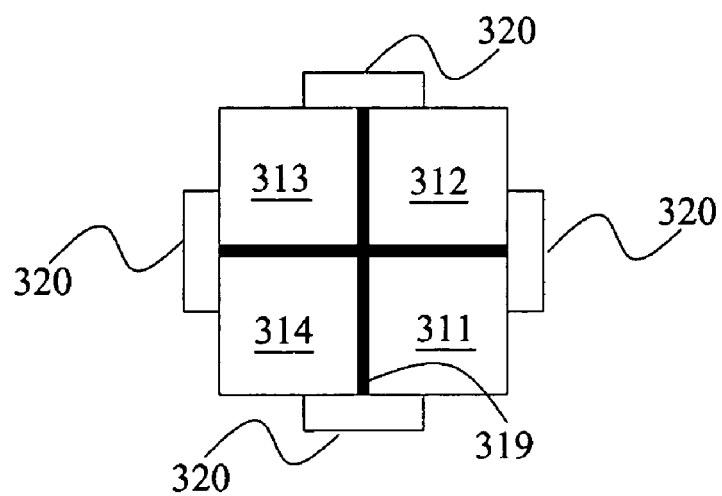
FIG. 4 is a top plan view of the semiconductor chip package of FIG. 3.

FIGS. 3 and 4 illustrate a semiconductor chip package in accordance with the second embodiment of the present invention. One of the differences between the first and second embodiments is the type of semiconductor chips used. In the second embodiment in FIGS. 3 and 4, the type of the semiconductor chips 320 are flip chips, so the insulating layer 319 for each mounting face 331, 332, 333 and 334 can be positioned at the center of the mounting faces 331, 332, 333 and 334. In other words, the plane area of each elongated conductor 311, 312, 313, 314 on both sides of the insulating layer 319 for each mounting face (e.g., conductors 311 and 312 for mounting face 331, and so on) can be equal. Therefore, the semiconductor chips 320 can be positioned at about the center of each of the mounting faces 331, 332, 333 and 334, and be electrically connected to the conductors 311, 312, 313 or 314 without the use of bonding wires.

Figure 5:
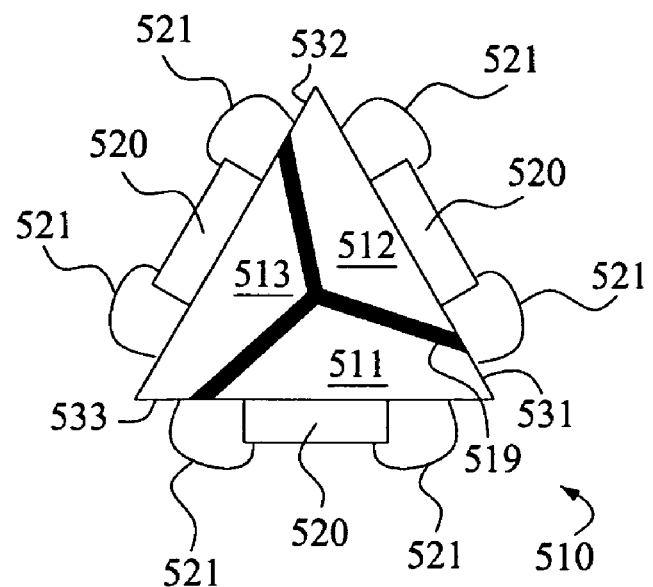
FIG. 5 is a top plan view of a semiconductor chip package in accordance with yet another embodiment of the present invention.

FIG. 5 illustrates a semiconductor chip package in accordance with a third embodiment of the present invention, which applies the same principles illustrated in connection with the embodiment of FIGS. 1 and 2. In FIG. 5, the pillar body 510 has a three-sided (e.g., generally triangular) configuration, and has three elongated conductors 511, 512 and 513 that are insulated from each other by a Y-shaped insulating layer 519. The shapes of the conductors 511, 512 and 513 are complementary to each other so as to form an equilateral triangular pillar body with three mounting faces 531, 532 and 533 which are evenly disposed around the periphery of the pillar body. In particular, each conductor 511, 512, 513 has four sides, with a short external side, a long external side that adjoins the short external side, and two adjoining internal sides bordered by the insulating layer 519. Each of the mounting faces 531, 532, 533 can have the same shape and size.

Mounting face 531 is a plane that is defined by the short external side of the conductor 511 and the long external side of the conductor 512 that are insulated by the insulating layer 519. Mounting face 532 is a plane that is defined by the short external side of the conductor 512 and the long external side of the conductor 513 that are insulated by the insulating layer 519. Mounting face 533 is a plane that is defined by the short external side of the conductor 513 and the long external side of the conductor 511 that are insulated by the insulating layer 519. In addition, each of the semiconductor chips 520 may be selectively and electrically connected to the conductors 511, 512, 513 at both sides of the insulating layer 519 (on each mounting face 531, 532, 533), or electrically connected to another semiconductor chip 520, via bonding wires 521.

Figure 6:
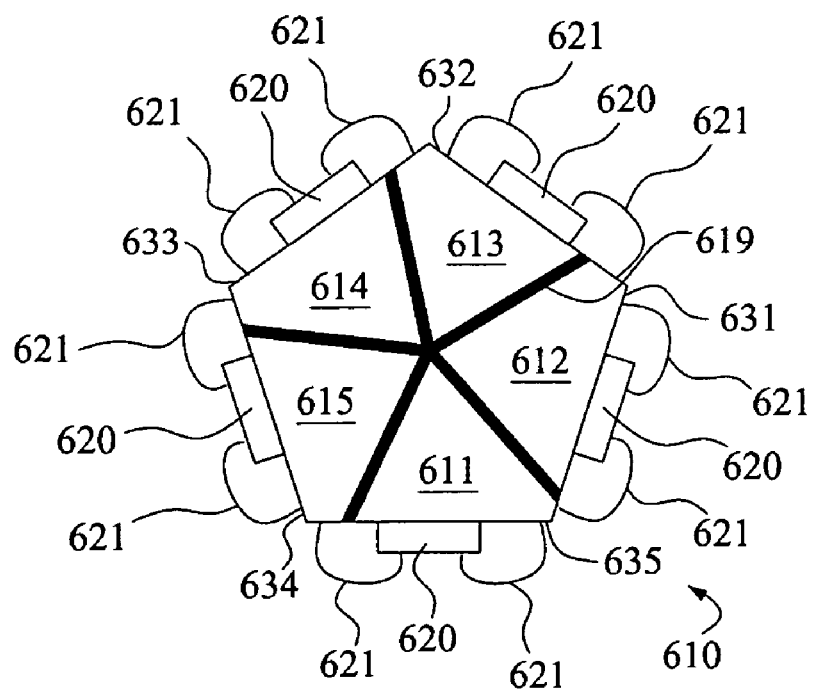
FIG. 6 is a top plan view of a semiconductor chip package in accordance with a further embodiment of the present invention.

FIG. 6 illustrates a semiconductor chip package in accordance with a fourth embodiment of the present invention, which applies the same principles illustrated in connection with the embodiment of FIGS. 1 and 2. In FIG. 6, the pillar body 610 has a five-sided (e.g., generally polygonal) configuration, and has five elongated conductors 611, 612, 613, 614 and 615 that are insulated from each other by a five-prong insulating layer 619. The shapes of the conductors 611, 612, 613, 614 and 615 are complementary to each other so as to form an equilateral pentagonal pillar body with five mounting faces 631, 632, 633, 634 and 635, which are evenly disposed around the periphery of the pillar body 610. In particular, each conductor 611, 612, 613, 614 and 615 has four sides, with a short external side, a long external side that adjoins the short external side, and two adjoining internal sides bordered by the insulating layer 619. Each of the mounting faces 631, 632, 633, 634, 635 can have the same shape and size.

Mounting face 631 is a plane that is defined by the short external side of the conductor 611 and the long external side of the conductor 612 that are insulated by the insulating layer 619. The other mounting faces 632, 633, 634, 635 are similarly defined (as described hereinabove for FIGS. 1, 2 and 5). In addition, each of the semiconductor chips 620 may be selectively and electrically connected to the conductors 611, 612, 613, 614, 615 at both sides of the insulating layer 619 (on each mounting face 631, 632, 633, 634, 635), or electrically connected to another semiconductor chip 620, via bonding wires 621.

In addition to the above embodiments, those skilled in the art will appreciate that equilateral or non-equilateral polygonal pillar bodies, having more than five conductors and having more than five mounting faces, can also be implemented in accordance with the spirit of the present invention. In addition, even though none of the top planes of the embodiments in FIGS. 1-6 are provided with any semiconductor chip, those skilled in the art will also appreciate semiconductor chips can be attached to any of the top planes of these embodiments so that these top planes are actually used as mounting faces.

Figure 7:
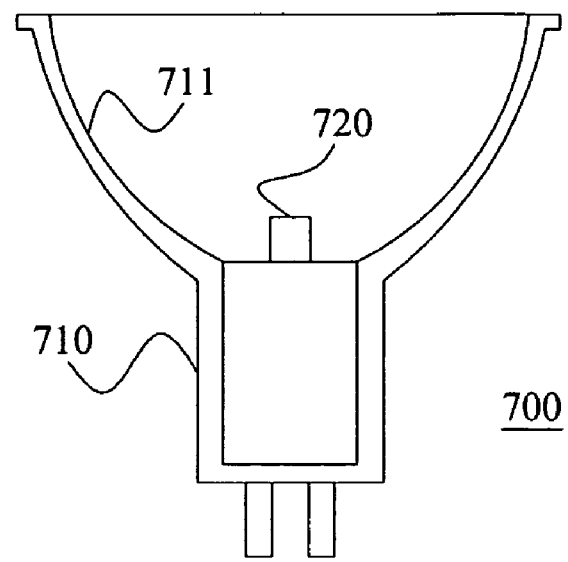
FIG. 7 is a diagram showing a semiconductor illuminator incorporating a semiconductor chip package of the present invention.

FIGS. 7 illustrates a semiconductor illuminator 700 in accordance with one embodiment of the present invention. The semiconductor illuminator 700 includes a housing 710 and a light source 720 that can be embodied in the form of any of the semiconductor chip packages shown and described in FIGS. 1-6 and 8, or any other semiconductor chip package that embodies the principles of the present invention.

The housing 710 of the semiconductor illuminator 700 has a generally concave reflecting cup 711 that functions to focus the light from the light source 720. The light source 720 is positioned in the center of the reflecting cup 711 such that the reflecting cup 711 can reflect the light from light source 720 to the front of the semiconductor illuminator 700. As described above, the pillar body of the light source 720 has a plurality of mounting faces to which semiconductor chips can be attached around their peripheries, so the light source 720 can include a greater number of semiconductor chips in a smaller body, and can also facilitate the light focusing function of the semiconductor illuminator 700. In addition, since the conductors of the pillar body of the light source 720 can be used as electrodes for supplying power to the semiconductor illuminator 700, and also can be heat coupled to the housing 710 or an additional heat sink (not shown) for heat dissipation, the heat generated by the semiconductor chips (such as high power LEDs) will be quickly dissipated, thereby improving the heat dissipation function of the semiconductor illuminator 700.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A semiconductor chip package, comprising:
   a pillar body including at least three conductors insulated from each other by an insulating layer, the pillar body having a periphery that includes a plurality of mounting faces, with each conductor defining a portion of two adjacent mounting faces, and with each mounting face defined by two adjacent conductors separated by a portion of the insulating layer; and
   a plurality of semiconductor chips attached on each of the mounting faces and selectively and electrically connected to the conductors.

2. The package of claim 1, wherein the mounting faces are evenly disposed around the periphery of the pillar body.

3. The package of claim 1, wherein the two conductors on each mounting face have different first and second surface areas, with the first surface area being larger than the second surface area.

4. A semiconductor chip package, comprising:
   a pillar body including at least three conductors insulated from each other by an insulating layer, the pillar body having a periphery that includes a plurality of mounting faces, with each mounting face defined by two adjacent conductors separated by a portion of the insulating layer; and
   a plurality of semiconductor chips attached on each of the mounting faces and selectively and electrically connected to the conductors;
   wherein the insulating layer is positioned off-center on each mounting face.

5. The package of claim 3, wherein the semiconductor chips of a mounting face are attached on the conductor which has the first surface area.

6. The package of claim 1, wherein the semiconductor chips are electrically connected to the conductors by bonding wires.

7. The package of claim 1, wherein the semiconductor chips are flip chips.

8. A semiconductor chip package, comprising:
   a pillar body including at least three conductors insulated from each other by an insulating layer, the pillar body having a periphery that includes a plurality of mounting faces, with each mounting face defined by two adjacent conductors separated by a portion of the insulating layer; and
   a plurality of semiconductor chips attached on each of the mounting faces and selectively and electrically connected to the conductors;
   wherein the semiconductor chips are LED chips.

9. The package of claim 1, wherein the two conductors on each mounting face have the same surface areas.

10. The package of claim 1, wherein the insulating layer is positioned at the center on each mounting face.

11. A semiconductor illuminator, comprising:
    a housing having a reflecting cup;
    a pillar body positioned inside the reflecting cup, the pillar body including at least three conductors insulated from each other by an insulating layer, the pillar body having a periphery that includes a plurality of mounting faces, with each mounting face defined by two adjacent conductors separated by a portion of the insulating layer; and
    a plurality of semiconductor chips attached on each of the mounting faces and selectively and electrically connected to the conductors.

12. The illuminator of claim 11, wherein the mounting faces are evenly disposed around the periphery of the pillar body.

13. The illuminator of claim 11, wherein the two conductors on each mounting face have different first and second surface areas, with the first surface area being larger than the second surface area.

14. The illuminator of claim 11, wherein the insulating layer is positioned off-center on each mounting face.

15. The illuminator of claim 13, wherein the semiconductor chips of a mounting face are attached on the conductor which has the first surface area.

16. The illuminator of claim 11, wherein the semiconductor chips are electrically connected to the conductors by bonding wires.

17. The illuminator of claim 11, wherein the semiconductor chips are flip chips.

18. The illuminator of claim 11, wherein the semiconductor chips are LED chips.

19. The illuminator of claim 11, wherein the two conductors on each mounting face have the same surface areas.

20. The illuminator of claim 11, wherein the insulating layer is positioned at the center of each mounting face.

21. The illuminator of claim 11, wherein each conductor defines a portion of two adjacent mounting faces.

* * * * *